(12) United States Patent
Esaki et al.

(10) Patent No.: US 9,748,100 B2
(45) Date of Patent: Aug. 29, 2017

(54) SUBSTRATE PROCESSING METHOD, STORAGE MEDIUM AND SUBSTRATE PROCESSING SYSTEM

(71) Applicant: TOKYO ELECTRON LIMITED, Tokyo (JP)

(72) Inventors: Tomonori Esaki, Koshi (JP); Shinichiro Kawakami, Koshi (JP); Takashi Yamauchi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/957,164

(22) Filed: Dec. 2, 2015

(65) Prior Publication Data

US 2016/0163560 A1  Jun. 9, 2016

(30) Foreign Application Priority Data

Dec. 4, 2014  (JP) ................................. 2014-245648

(51) Int. Cl.
| | | |
|---|---|---|
| H01L 21/31 | (2006.01) | |
| H01L 21/027 | (2006.01) | |
| H01L 21/311 | (2006.01) | |
| H01L 21/67 | (2006.01) | |
| H01L 21/677 | (2006.01) | |

(52) U.S. Cl.
CPC .... *H01L 21/0271* (2013.01); *H01L 21/31138* (2013.01); *H01L 21/67178* (2013.01); *H01L 21/67748* (2013.01)

(58) Field of Classification Search
CPC . C09D 153/00; C09D 153/005; H01L 21/308; H01L 21/3081; H01L 21/3086; H01L 21/3088
See application file for complete search history.

(56) References Cited

U.S. PATENT DOCUMENTS

| | | | | |
|---|---|---|---|---|
| 3,664,899 A | * | 5/1972 | Wright | ...................... G03F 7/42 216/48 |
| 9,111,875 B2 | * | 8/2015 | Yamamoto | .......... H01L 21/3088 |
| 2013/0309457 A1 | * | 11/2013 | Rathsack | .............. G03F 7/0002 428/195.1 |

FOREIGN PATENT DOCUMENTS

| | | |
|---|---|---|
| JP | 2010-53263 | 3/2010 |
| JP | 2012-109322 A | 6/2012 |
| JP | 2013-68882 A | 4/2013 |
| JP | 2014-27228 A | 2/2014 |

OTHER PUBLICATIONS

Tang et al., Rapid formation of block copolymer thin film based on infrared laser irradiation, Cleo Pacific Rim 2007.*

* cited by examiner

*Primary Examiner* — Syed Gheyas
(74) *Attorney, Agent, or Firm* — Nath, Goldberg & Meyer; Jerald L. Meyer; Annie J. Kock

(57) ABSTRACT

There is provided a method of processing a substrate using a block copolymer composed of a first polymer containing an oxygen atom and a second polymer containing no oxygen atom, the method including: coating the block copolymer onto the substrate on which a predetermined pattern is formed; phase-separating the block copolymer into the first polymer and the second polymer; and heating the substrate in a low oxygen atmosphere to selectively remove the first polymer from the phase-separated block copolymer.

7 Claims, 15 Drawing Sheets

SUBSTRATE PROCESSING METHOD, STORAGE MEDIUM AND SUBSTRATE PROCESSING SYSTEM

CROSS-REFERENCE TO RELATED APPLICATION

This application claims the benefit of Japanese Patent Application No. 2014-245648, filed on Dec. 4, 2014, in the Japan Patent Office, the disclosure of which is incorporated herein in its entirety by reference.

TECHNICAL FIELD

The present disclosure relates to a method of processing a substrate using a block copolymer composed of a first polymer containing an oxygen atom and a second polymer containing no oxygen atom, a non-transitory computer-readable storage medium and a substrate processing system.

BACKGROUND

For example, in a semiconductor device manufacturing process, a photolithography method including a sequence of processes such as a resist coating process of coating a resist solution onto a semiconductor wafer (hereinafter, referred to as a "wafer") used as a substrate to form a resist film, an exposure process of exposing the resist film into a predetermined pattern, a developing process of developing the exposed resist film and the like, is performed to form a predetermined resist pattern on the wafer. Subsequently, an etching process of etching a target film of the wafer using the resist pattern as a mask, a removal process of removing the resist film and the like are sequentially performed. Thus, the predetermined pattern is formed on the target film.

In recent years, there is a demand for miniaturizing a pattern of the aforementioned target film to realize further high integration of the semiconductor device. To do this, a miniaturation of the resist pattern is in progress. As an example, a wavelength of light used in the exposure process of the photolithography method has been shortened. However, there are technical limitations and cost restrictions in shortening a wavelength of light emitted from an exposure light source. This makes it difficult to form a fine resist pattern on the order of, e.g., several nanometers, only by shortening the wavelength of light.

To address this, as a pattern forming method substitutable for the photolithography method, there is proposed a method of processing a wafer using a block copolymer constituted by combining two types of polymers such as polymethyl methacrylate (PMMA) and polystyrene (PS). In such a method, a pattern region having high affinity with respect to one of the polymers is first formed on the water. Subsequently, for example, a resist pattern is formed on the pattern region. Thereafter, the block copolymer is coated onto the wafer with the resist pattern formed thereon, and subsequently, the block copolymer is phase-separated. Thus, one of the phase-separated polymers is arranged in a region having high affinity with respect to the respective phase-separated polymer and the other is positioned adjacent to the arranged polymer.

In addition, when one of the polymers (in this case, polymethyl methacrylate) is selectively removed by etching using, for example, an oxygen plasma or the like, a fine pattern is formed on the wafer by polystyrene used as the other polymer. Subsequently, a target film is etched using the pattern of polystyrene as a mask so that a predetermined pattern is formed on the target film.

However, in the etching process using the oxygen plasma as described above, since a selectivity of polymethyl methacrylate to polystyrene falls within a range from about 3:1 to 7:1, when the polymethyl methacrylate is removed, a film thickness of the polystyrene may be also decreased. This fails to secure a required film thickness of the polystyrene when the polystyrene is used as an etching mask in a subsequent process.

The present inventors extensively studied how to increase selectivity from one of the polymers to the other when selectively removing one of the polymers from a phase-separated block copolymer. As a result, the present inventors have found that, when the phase-separated block copolymer is heated in a low oxygen atmosphere, a first polymer containing an oxygen atom is substantially decomposed, volatilized and removed, while a second polymer containing no oxygen atom is substantially not changed in a film thickness.

SUMMARY

Some embodiments of the present disclosure provide a method and system of processing a substrate using a block copolymer composed of a first polymer containing an oxygen atom and a second polymer containing no oxygen atom, which are capable of securing a high selectivity of the first polymer to the second polymer when selectively removing the first polymer containing the oxygen atom, thus properly forming a predetermined pattern on the substrate, and a storage medium therefor.

According to one aspect of the present disclosure, there is provided a method of processing a substrate using a block copolymer composed of a first polymer containing an oxygen atom and a second polymer containing no oxygen atom, the method including: coating the block copolymer onto the substrate on which a predetermined pattern is formed; phase-separating the block copolymer into the first polymer and the second polymer; and after phase-separating the block copolymer, heating the substrate in a low oxygen atmosphere to selectively remove the first polymer from the phase-separated block copolymer.

According to another aspect of the present disclosure, there is provided a method of processing a substrate using a block copolymer composed of a first polymer containing an oxygen atom and a second polymer containing no oxygen atom, the method including: coating the block copolymer onto a substrate on which a predetermined pattern is formed; phase-separating the block copolymer into the first polymer and the second polymer; after phase-separating the block copolymer, irradiating the substrate with ultraviolet rays; and heating the substrate irradiated with the ultraviolet rays in a low oxygen atmosphere to selectively remove the first polymer from the phase-separated block copolymer.

According to yet another aspect of the present disclosure, there is provided a non-transitory computer-readable storage medium having a program operating on a computer stored therein, wherein the program, when executed, causes the computer to perform the aforementioned method using a substrate processing system.

According to still another aspect of the present disclosure, there is provided a system of processing a substrate using a block copolymer composed of a first polymer containing an oxygen atom and a second polymer containing no oxygen atom, the system including: a block copolymer coating apparatus configured to coat the block copolymer onto a substrate on which a predetermined pattern is formed; a polymer separating apparatus configured to heat the substrate with the block copolymer coated thereonto at a first temperature and configured to phase-separate the block copolymer into the first polymer and the second polymer; and a polymer removal apparatus configured to heat the substrate at a second temperature higher than the first temperature in a low-oxygen atmosphere and configured to selectively remove the first polymer from the phase-separated block copolymer.

According to still another aspect of the present disclosure, there is provided a system of processing a substrate using a block copolymer composed of a first polymer containing an oxygen atom and a second polymer containing no oxygen atom, the system including: a block copolymer coating apparatus configured to coat the block copolymer onto a substrate on which a predetermined pattern is formed; a polymer separating apparatus configured to phase-separate the block copolymer into the first polymer and the second polymer; and a polymer removal apparatus configured to heat the substrate in a low oxygen atmosphere and configured to selectively remove the first polymer from the phase-separated block copolymer.

According to still another aspect of the present disclosure, there is provided a system of processing a substrate using a block copolymer composed of a first polymer containing an oxygen atom and a second polymer containing no oxygen atom, the system including: a block copolymer coating apparatus configured to coat the block copolymer onto a substrate on which a predetermined pattern is formed; a polymer separating apparatus configured to heat the substrate with the block copolymer coated thereonto and configured to phase-separate the block copolymer into the first polymer and the second polymer; an ultraviolet ray irradiation apparatus configured to irradiate the substrate heated by the polymer separating apparatus with ultraviolet rays; and a polymer removal apparatus configured to heat the substrate irradiated with the ultraviolet rays by the ultraviolet ray irradiation apparatus in a low-oxygen atmosphere and configured to selectively remove the first polymer from the phase-separated block copolymer.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
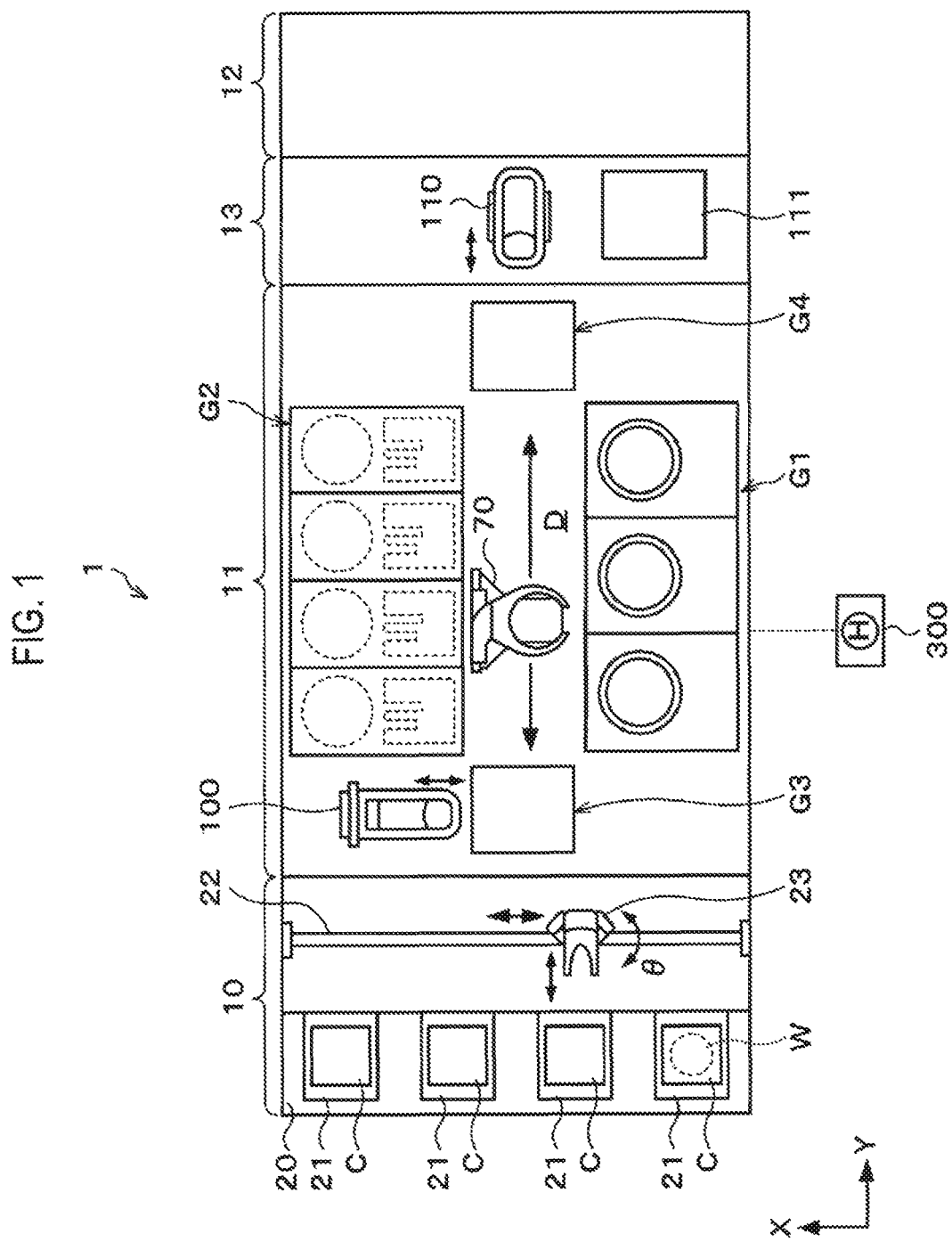
FIG. 1 is a plan view showing a schematic configuration of a substrate processing system according to an embodiment of the present disclosure.

Hereinafter, some embodiments of the present disclosure will be described. Also, through all drawings, the same reference numeral is assigned to the same component. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 2:
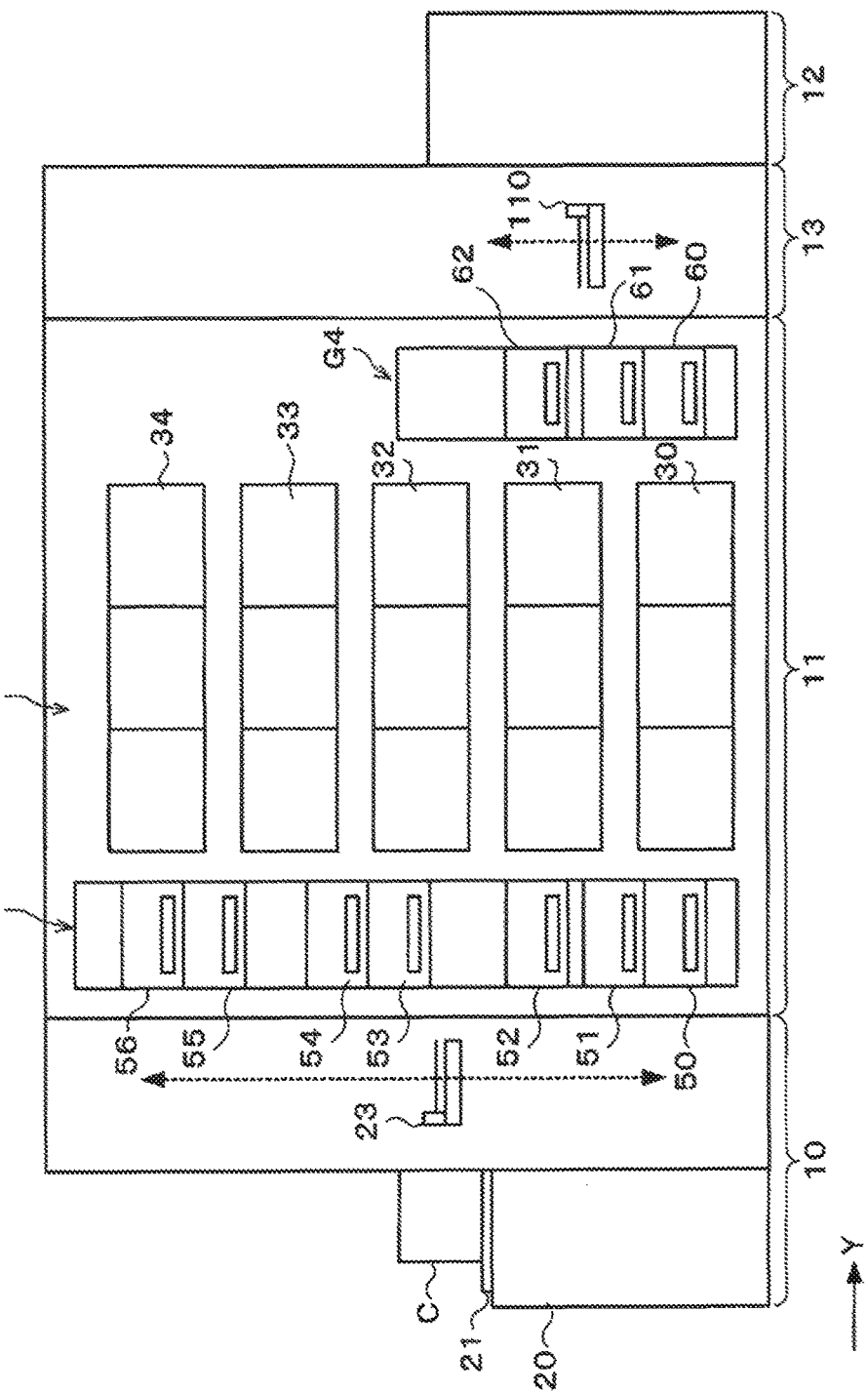
FIG. 2 is a front view showing a schematic configuration of a substrate processing system according to an embodiment of the present disclosure.
Figure 3:
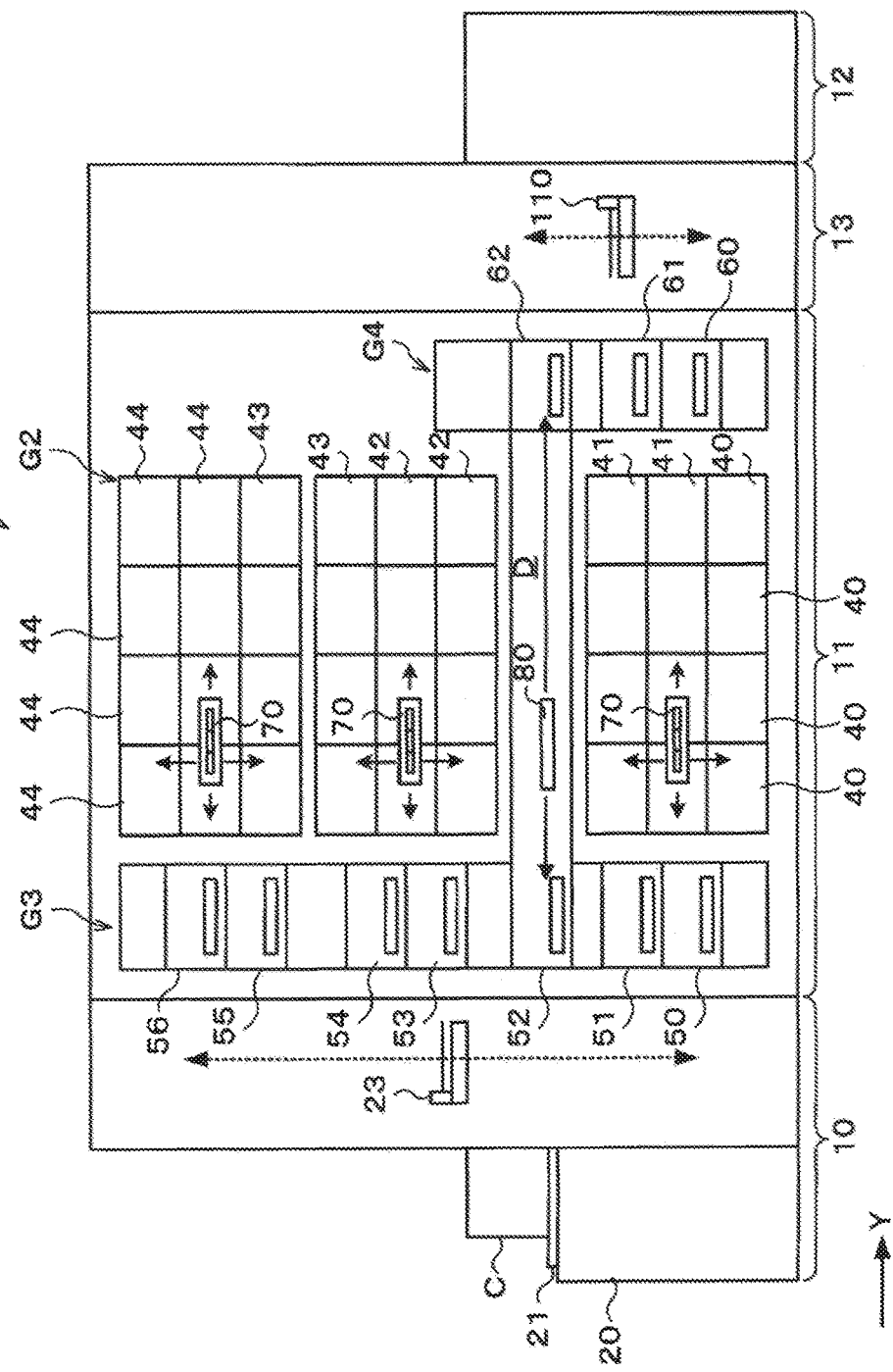
FIG. 3 is a rear view showing a schematic configuration of a substrate processing system according to an embodiment of the present disclosure.

FIG. 1 is a view showing a schematic configuration of a substrate processing system 1 according to an embodiment of the present disclosure. FIG. 2 is a front view schematically showing an internal configuration of the substrate processing system 1, and FIG. 3 is a rear view schematically showing the internal configuration of the substrate processing system 1.

As shown in FIG. 1, the substrate processing system 1 includes: a cassette station 10 in which cassettes C configured to accommodate a plurality of wafers W are carried in and carried out between the cassette station 10 and outside the substrate processing system 1; a process station 11 including various types of processing apparatuses configured to perform predetermined processes on the wafer W; and an interface station 13 configured to transfer the wafer W between the process station 11 and an exposure apparatus 12 disposed adjacent to the process station 11. The cassette station 10, the process station 11 and the interface station 13 are integratedly connected to each other.

The cassette station 10 includes a cassette loading table 20. A plurality of (e.g., four) cassette loading boards 21 is installed in the cassette loading table 20. The cassette loading boards 21 load respective cassettes C thereon when they are carried in and out between the cassette station 10 and outside of the substrate processing system 1, respectively.

The cassette station 10 includes a wafer transfer device 23 that is movable along a transfer path 22 extending in an X-direction as shown in FIG. 1. The wafer transfer device 23 is movable in a vertical direction and rotatable about a vertical axis (in a θ-direction). The wafer transfer device 23 is configured to transfer the wafer W between the cassettes C loaded on the respective cassette loading boards 21 and a delivery device of a third block G3 of the process station 11 (which will be described later).

The process station 11 includes a plurality of (e.g., four) blocks G1, G2, G3 and G4 equipped with various apparatuses. For example, the first block G1 is installed at a front side of the process station 11 (at a backward side in the X-direction of FIG. 1). The second block G2 is installed at a rear side of the process station 11 (at a forward side in the X-direction of FIG. 1). The third block G3 is installed at a side adjacent to the cassette station 10 in the process station 11 (at a backward side in the Y-direction of FIG. 1). The fourth block G4 is installed at a side adjacent to the interface station 13 in the process station 11 (at a forward side in the Y-direction of FIG. 1).

For example, as shown in FIG. 2, the first block G1 is provided with a plurality of liquid processing apparatuses such as developing apparatuses 30 configured to develop the wafer W, an anti-reflection film forming apparatus 31 configured to form an anti-reflection film on the wafer W, a neutral layer forming apparatus 32 configured to form a neutral layer by coating a neutral agent onto the wafer W, a resist coating apparatus 33 configured to form a resist film by coating a resist solution onto the wafer W, and a block copolymer coating apparatus 34 configured to coat a block copolymer onto the wafer W. Theses apparatuses are stacked in that order from the bottom.

For example, the developing apparatus 30, the anti-reflection film forming apparatus 31, the neutral layer forming apparatus 32, the resist coating apparatus 33 and the block copolymer coating apparatus 34 are respectively arranged step-by-step in a horizontal line by three. In some embodiments, the number of the liquid processing apparatuses or the arrangement thereof may be arbitrarily selected. Moreover, in the liquid processing apparatuses, a spin coating for coating a predetermined coating solution onto the wafer W is performed. Such a spin coating includes discharging the predetermined coating solution from a coating nozzle toward the wafer W, and simultaneously, rotating the wafer W to spread the coating solution over a surface of the wafer W.

Further, a block copolymer that is coated onto the wafer W by the block copolymer coating apparatus 34 is a high molecule (copolymer) composed of a first polymer (a polymer of a first monomer) and a second polymer (a polymer of a second monomer). Here, the first monomer and the second monomer are overlapped in a straight-chain shape. A polymer containing an oxygen atom in a structure of the high molecule is used as the first polymer, and the other polymer containing no oxygen atom in the structure of the high molecule is used as the second polymer. In this embodiment, for example, polymethyl methacrylate is used as the first polymer and polystyrene is used as the second polymer. In a molecular weight of the block copolymer, a ratio of the first polymer is set to about 40 to 60% and a ratio of the second polymer is set to about 60 to 40%. The block copolymer used in this embodiment has a solution form obtained by dissolving the block copolymer composed of the first polymer and the second polymer with a solvent. Heptane is used as the solvent.

Further, the neutral layer formed on the wafer W by the neutral layer forming apparatus 32 has a middle-level affinity with respect to the first polymer and the second polymer. In this embodiment, for example, a random copolymer or an alternating copolymer composed of the first polymer and the second polymer is used as the neutral layer. Hereinafter, the term "neutral" means that the layer has the middle-level affinity with respect to the first polymer and the second polymer as described above.

For example, as shown in FIG. 3, the second block G2 is provided with a plurality of heat processing apparatuses 40 configured to perform a heating process of heating or cooling down the wafer W, polymer separating apparatuses 41 configured to heat the block copolymer coated onto the wafer W by the block copolymer coating apparatus 34 at a first temperature such that the block copolymer is phase-separated into the first polymer and the second polymer, adhesion apparatuses 42 configured to hydrophobize the wafer W, peripheral exposure apparatuses 43 configured to expose a peripheral portion of the wafer W, and polymer removal apparatuses 44 configured to heat the wafer W at a second temperature after the block copolymer is phase-separated such that, for example, the first polymer is selectively removed. These apparatuses 40, 41, 42, 43 and 44 are respectively arranged step-by-step in vertical and horizontal directions. The heat processing apparatus 40 includes a heating plate configured to heat the wafer W mounted thereon and a temperature adjusting plate configured to adjust a temperature of the wafer W mounted thereon, thus performing both a heating process and a temperature adjusting process. Also, the polymer separating apparatus 41 and the polymer removal apparatus 44 perform the heating process on the wafer W. Configurations of the polymer separating apparatus 41 and the polymer removal apparatus 44 will be described later. In some embodiments, the number of the heat processing apparatuses 40, the polymer separating apparatuses 41, the adhesion apparatuses 42, the peripheral exposure apparatuses 43, and the polymer removal apparatuses 44 or an arrangement thereof may be arbitrarily selected.

For example, the third block G3 is provided with a plurality of delivery devices 50, 51, 52, 53, 54, 55 and 56 which are arranged in that order from the bottom. Also, the fourth block G4 is provided with a plurality of delivery devices 60, 61 and 62 which are arranged in that order from the bottom.

As shown in FIG. 1, an area surrounded by the first block G1 to the fourth block G4 is defined as a wafer transfer zone D. In the wafer transfer zone D, a plurality of wafer transfer devices 70 is disposed. Each of the plurality of wafer transfer devices 70 includes, for example, a transfer arm which is movable along the Y-direction, the X-direction, the θ-direction and the vertical direction. The wafer transfer device 70 is configured to transfer the wafer W to a respective apparatus in the first block G1 to the fourth block G4 while moving within the wafer transfer zone D.

In addition, as shown in FIG. 3, in the wafer transfer zone D, a shuttle transfer device 80 configured to linearly transfer the wafer W between the third block G3 and the fourth block G4 is disposed.

The shuttle transfer device 80 is configured to linearly move in, e.g., the Y-direction. The shuttle transfer device 80 is configured to move in the Y-direction while holding the wafer W such that the wafer W is transferred between the delivery device 52 of the third block G3 and the delivery device 62 of the fourth block G4.

As shown in FIG. 1, a wafer transfer device 100 is disposed in proximity of the third block G3 at the forward side of the X-direction. The wafer transfer device 100 includes a transfer arm (not shown) which is movable in, e.g., the X-direction, the θ-direction and the vertical direction. The wafer transfer device 100 is configured to move up and down while holding the wafer W to transfer the wafer W to a respective delivery device of the third block G3.

The interface station 13 is provided with a wafer transfer device 110 and a delivery device 111. The wafer transfer device 110 includes a transfer arm (not shown) which is movable in, e.g., the Y-direction, the θ-direction and the vertical direction. The wafer transfer device 110 is configured to transfer the wafer W supported by the transfer arm between a respective delivery device of the block G4, the delivery device 111 and the exposure apparatus 12.

Figure 4:
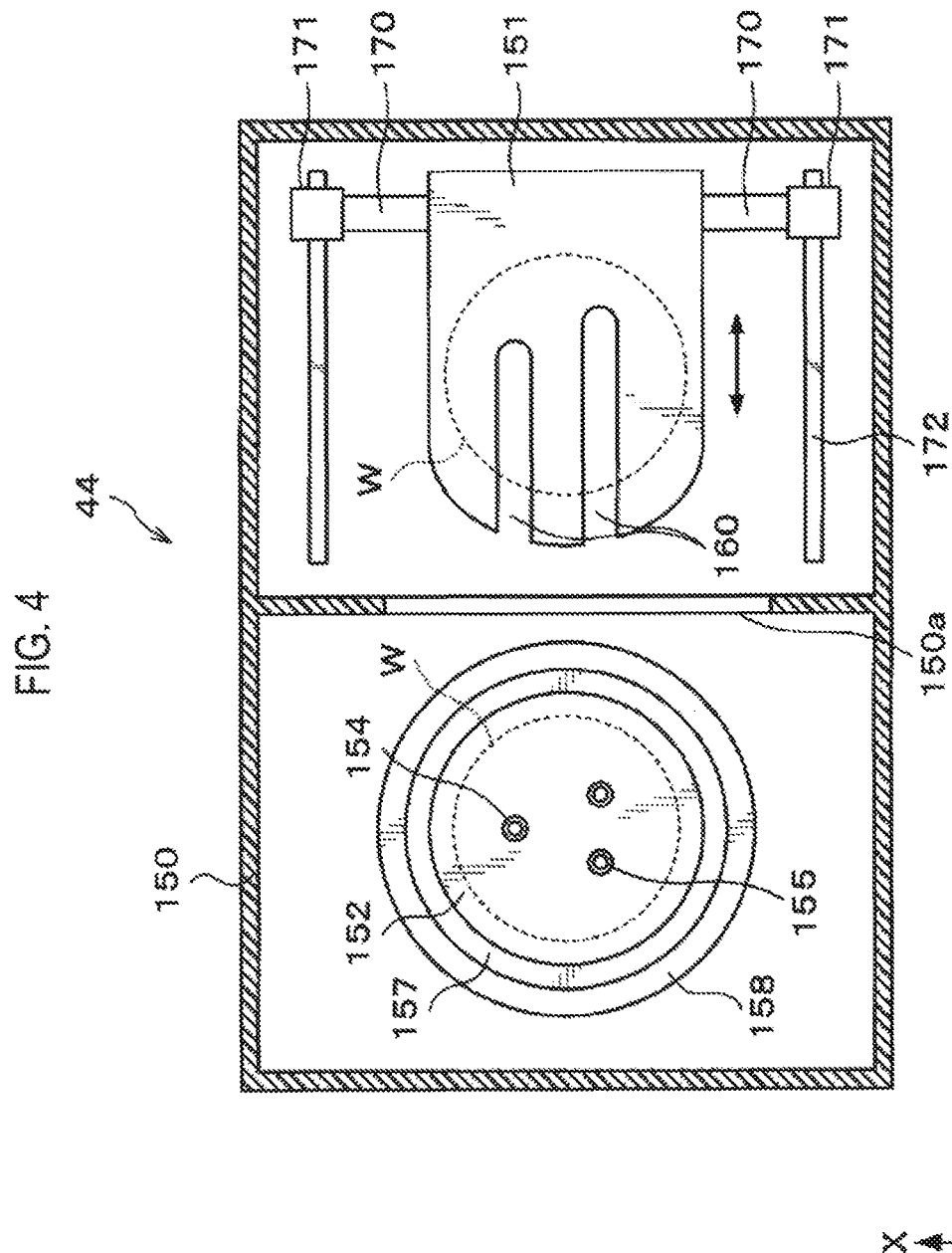
FIG. 4 is a transversal cross-sectional view showing a schematic configuration of a polymer removal apparatus.

Next, a configuration of the polymer removal apparatus 44 as described above will be described. FIG. 4 is a transverse cross-sectional view showing a schematic configuration of the polymer removal apparatus 44, and FIG. 5 is a longitudinal cross-sectional view showing the schematic configuration of the polymer removal apparatus 44.

For example, the polymer removal apparatus 44 includes a housing 150, a temperature adjusting plate 151 for adjusting the temperature of the wafer W mounted thereon, and a heating plate 152 for heating the wafer W mounted thereon. The temperature adjusting plate 151 and the heating plate 152 are arranged inside the housing 150 side-by-side in, e.g., the Y-direction of FIG. 4. As shown in FIG. 5, the housing 150 is formed in a container shape in which a portion facing the temperature adjusting plate 151 in the housing 150 is entirely opened and a portion facing the heating plate 152 in the housing 150 is provided to have a ceiling. A transfer port 150a through which the temperature adjusting plate 151 passes is formed in a partition wall 150b between the temperature adjusting plate 151 and the heating plate 152 in the housing 150.

The heating plate 152 is formed in a substantially disk shape having a thickness. The heating plate 152 has a horizontal upper surface on which, for example, suction holes (not shown) for suctioning the wafer W are formed. By the suction through the suction holes, the wafer W can be sucked and held on the heating plate 152.

Figure 5:
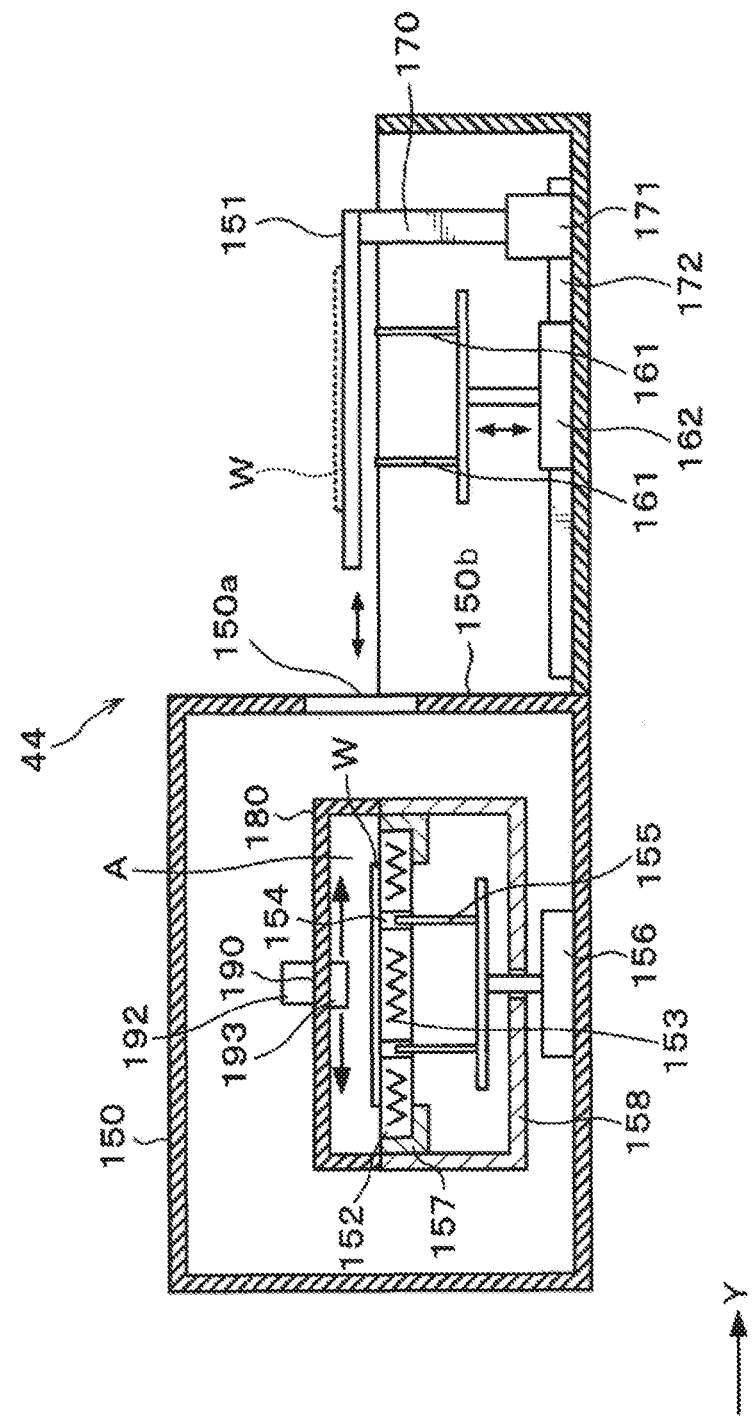
FIG. 5 is a longitudinal cross-sectional view showing a schematic configuration of a polymer removal apparatus.

As shown in FIG. 5, a heating mechanism 153 configured to heat the heating plate 152 is installed inside the heating plate 152. An example of the heating mechanism 153 includes an electric heater. Power supplied to the heating mechanism 153 is controlled by a controller 300 (which will be described later) such that the heating plate 152 is maintained at a predetermined setting temperature.

The heating plate 152 has a plurality of through holes 154 formed to vertically penetrate through heating plate 152. Elevating pins 155 are inserted through the through holes 154, respectively. The elevating pins 155 are configured to move up and down with an operation of an elevating drive mechanism 156 such as a cylinder. The elevating pins 155 are inserted through the through holes 154 such that they project from the upper surface of the heating plate 152. Thus, the wafer W can be elevated while being supported by the elevating pins 155.

The heating plate 152 is held by an annular holding member 157 which surrounds a periphery of the heating plate 152. The holding member 157 is supported by a cylindrical support ring 158 which surrounds a periphery of the holding member 157 and accommodates the elevating pins 155 therein.

As shown in FIG. 4, the temperature adjusting plate 151 has a substantially flat rectangular shape in which an end surface facing the heating plate 152 side is bent in a circular arc shape. In the temperature adjusting plate 151, two slits 160 are formed in the Y-direction. The slits 160 prevent the temperature adjusting plate 151 from interfering with the elevating pins 155 and elevating pins 161 disposed below the temperature adjusting plate 151. The elevating pins 161 are configured to move up and down by an elevating drive mechanism 162 such as a cylinder. In addition, a temperature control member (not shown), e.g., a Peltier element, is incorporated in the temperature adjusting plate 151.

As shown in FIG. 4, the temperature adjusting plate 151 is supported by a support arm 170. The support arm 170 is connected to drive parts 171. The drive parts 171 are installed in rails 172 extending in the Y-direction, respectively. The rails 172 are installed below the temperature adjusting plate 151 and extend to reach up to the vicinity of a lower portion of the partition wall 150b. The temperature adjusting plate 151 is configured to move along the rails 172 up to and above the heating plate 152 with the operation of the drive part 171. This configuration allows the temperature adjusting plate 151 to function as a transfer mechanism for transferring the wafer W between the heating plate 152 and the temperature adjusting plate 151.

For example, a cylindrical cover body 180 having the substantially same diameter as the support ring 158 is installed above the heating plate 152. A gas supply port 190 is formed in a substantially central portion in a ceiling of the cover body 180. The gas supply port 190 is connected to a gas supply source 192. A supply nozzle 193 having a substantially disk shape is installed in the gas supply port 190. Supply holes (not shown) are formed in a peripheral portion of the supply nozzle 193 such that a predetermined gas or vapor supplied from the gas supply source 192 is radially supplied in a diametrical direction of the wafer.

The cover body 180 is configured to vertically move up and down with an operation of an elevating mechanism (not shown). For example, as shown in FIG. 5, the cover body 180 is moved down such that a lower end surface of the cover body 180 is brought into contact with an upper end surface of the support ring 158, thus keeping a space A surrounded by the holding member 157, the support ring 158, the heating plate 152 and the cover body 180 in a substantially airtight state. In addition, an exhaust hole (not shown) is formed in an upper surface of the holding member 157 such that the gas supplied from the gas supply source 192 is exhausted through the exhaust hole. With this configuration, it is possible to supply the predetermined gas or the vapor (hereinafter, collectively referred to as a "process gas" in some cases) from the gas supply source 192 while exhausting the space A with the cover body 180 brought into contact with the support ring 158, thus keeping the wafer W mounted on the heating plate 152 in a process gas atmosphere using the process gas of a minimal amount. Further, in this embodiment, the process gas supplied from the gas supply source 192 is a non-oxidizing gas such that the interior of the space A is kept in a low oxygen atmosphere. An example of the non-oxidizing gas may include an inert gas such as a nitrogen gas or an argon gas.

Also, the polymer separating apparatus 41 is similar in configuration to the polymer removal apparatus 44. In addition, the heat processing apparatus 40 is similar in configuration to the polymer removal apparatus 44 except that the gas supply port 190 is not formed in the cover body 180.

As shown in FIG. 1, the substrate processing system 1 configured as above includes the controller 300. The controller 300 is, for example, a computer, and is provided with a program storage part (not shown). The program storage part stores a program that controls a wafer process r substrate process) performed by the substrate processing system 1. In addition, the program storage part stores a program for controlling operations of driving systems such that various types of processing apparatuses or the transfer devices as described above realize the substrate process (which will be described later) of the substrate processing system 1. In some embodiments, the aforementioned programs may be recorded in a computer-readable storage medium H such as a hard disk (HD), a flexible disk (FD), a compact disk (CD), a magneto-optical disk (MO), and a memory card, or may be installed into the controller 300 from the storage medium H.

Figure 6:
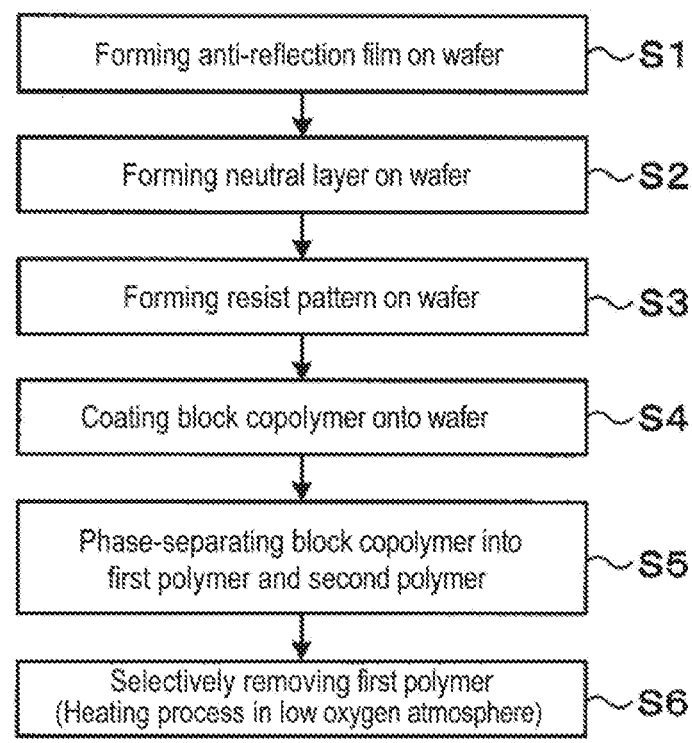
FIG. 6 is a flowchart showing main operations of a wafer process.

The substrate processing system 1 according to this embodiment is configured as described above. Next, the wafer process performed by the substrate processing system 1 configured as above will be described. FIG. 6 is a flowchart showing main operations of the wafer process.

First, the cassette C having the plurality of wafers W accommodated therein is transferred to the cassette station 10 of the substrate processing system 1. Subsequently, the wafers W accommodated in the cassette C are sequentially transferred to the delivery device 53 of the process station 11 by the wafer transfer device 23.

Figure 7:
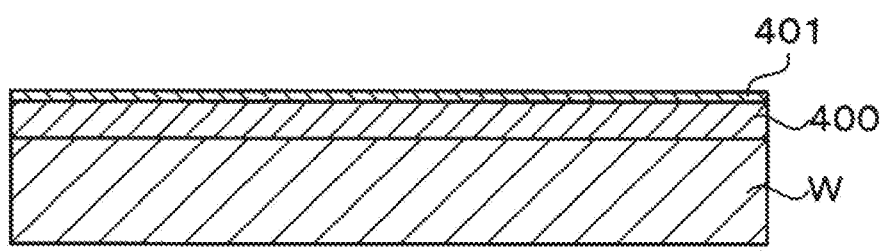
FIG. 7 is a longitudinal cross-sectional view showing a state in which an anti-reflection film and a neutral layer are formed on a wafer.

Thereafter, the wafer W is transferred to the heat processing apparatus 40 where a temperature of the wafer W is adjusted. Subsequently, the wafer W is transferred to the anti-reflection film forming apparatus 31 where an anti-reflection film 400 is formed on the wafer W as shown in FIG. 7 (Step S1 in FIG. 6). Thereafter, the wafer W is transferred to the heat processing apparatus 40 where the temperature of the wafer W is adjusted by heating.

Thereafter, the wafer W is transferred to the neutral layer forming apparatus 32 where a neutral agent is applied to the anti-reflection film 400 of the wafer W as shown in FIG. 7 such that a neutral layer 401 is formed on the wafer W (Step S2 of FIG. 6). Thereafter, the wafer W is transferred to the heat processing apparatus 40 where the temperature of the wafer W is adjusted by heating.

Subsequently, the wafer W is transferred to the adhesion apparatus 42 where the wafer W is subjected to an adhesion process. Thereafter, the wafer W is transferred to the resist coating apparatus 33 where a resist solution is coated onto the neutral layer 401 of the wafer W such that a resist is formed on the neutral layer 401. Subsequently, the wafer W is transferred to the heat processing apparatus 40 where the wafer W is subjected to a pre-baking process. Thereafter, the wafer W is transferred to the peripheral exposure apparatus 43 where the wafer W is subjected to a peripheral exposure process.

Figure 8:
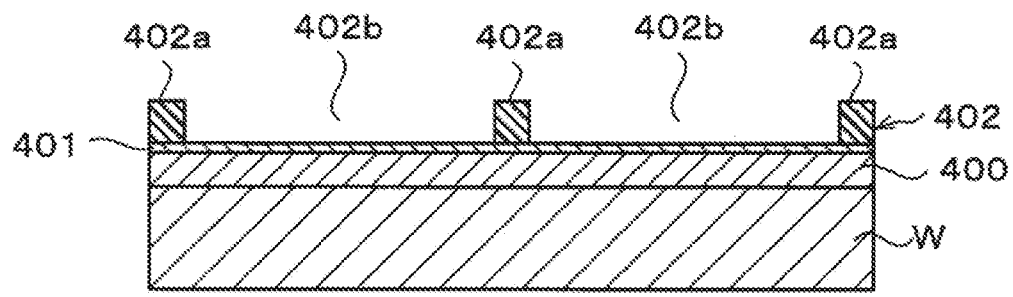
FIG. 8 is a longitudinal cross-sectional view showing a state in which a resist pattern is formed on the wafer.

Then, the wafer W is transferred to the exposure apparatus 12 by the wafer transfer device 110 of the interface station 13 where the wafer W is subjected to an exposure process. Thereafter, the wafer W is transferred to the heat processing apparatus 40 where the wafer W is subjected to a post-exposure baking process. Subsequently, the wafer W is transferred to the developing apparatus 30 where the wafer W is subjected to a developing process. After the developing process, the wafer W is transferred to the heat processing apparatus 40 where the wafer W is subjected to a post-baking process. Thus, as shown in FIG. 8, a predetermined resist pattern 402 is formed on the neutral layer 401 of the wafer W by the resist film (Step S3 in FIG. 6). In this embodiment, the resist pattern 402 is the so-called line-and-space pattern having linear line portions 402*a* and linear space portions 402*b* when viewed from the top. Also, a width of the space portion 402*b* is set such that the first polymer and the second polymer are alternately arranged in the space portion 402*b* by odd-numbered layers (which will be described later).

Figure 9:
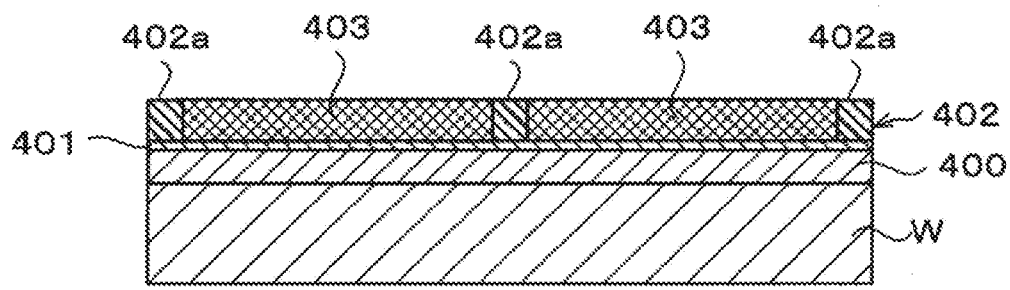
FIG. 9 is a longitudinal cross-sectional view showing a state in which a block copolymer is coated onto the wafer.

The wafer W with the resist pattern 402 formed thereon is transferred to the block copolymer coating apparatus 34 where the block copolymer 403 is coated onto the wafer W as shown in FIG. 9 (in a block copolymer coating process; Step S4 of FIG. 6).

Figure 10:
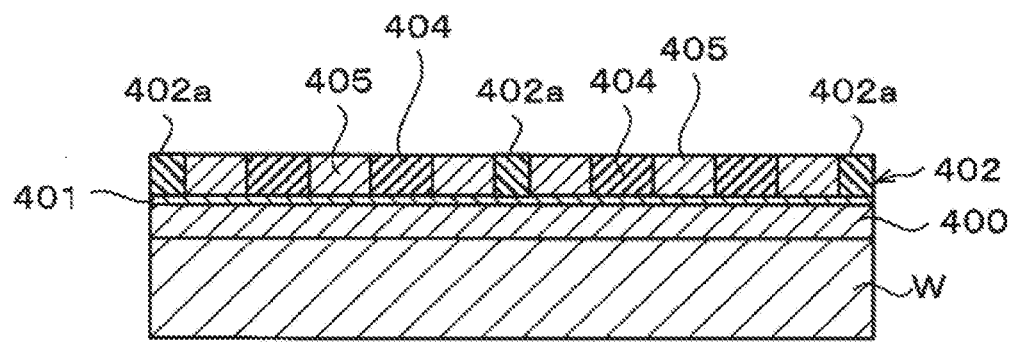
FIG. 10 is a longitudinal cross-sectional view showing a state in which the block copolymer is phase-separated into a first polymer and a second polymer.
Figure 11:
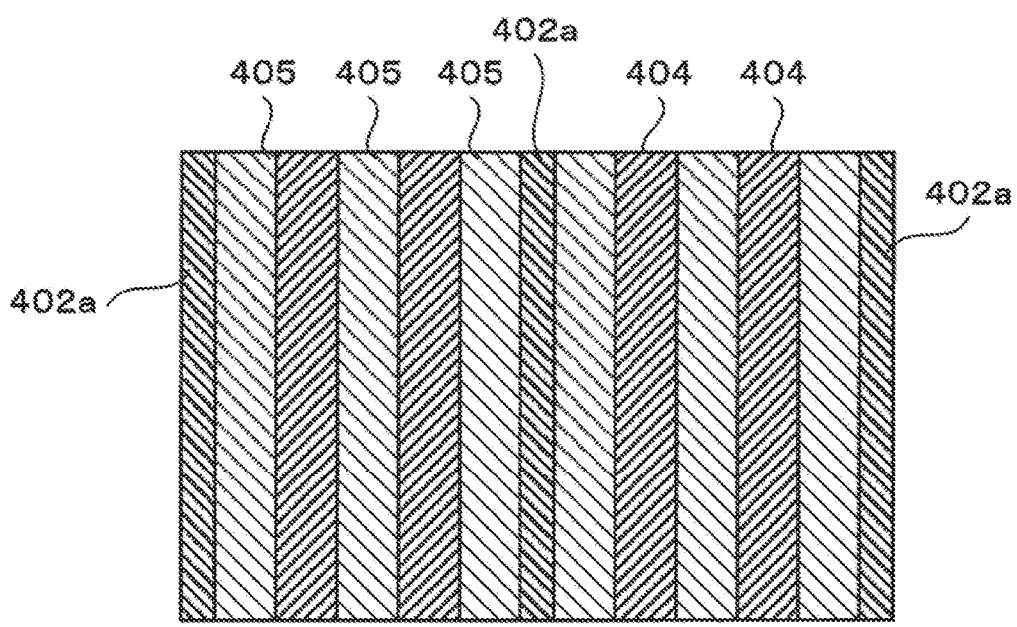
FIG. 11 is a plan view showing astute in which the block copolymer is phase-separated into a first polymer and a second polymer.

Thereafter, the wafer W is transferred to the polymer separating apparatus 41 where the wafer W is heated at a first temperature. The first temperature is a sufficient temperature to phase-separate the block copolymer 403 of the solution state into the first polymer and the second polymer, and to substantially volatilize the solvent in the block copolymer 403. In some embodiments, the first temperature may fall within a range from about room temperature to 300 degrees C., and especially, from 200 to 300 degrees C. The expression "substantially volatilize the solvent in the block copolymer 403" means that the solvent in the block copolymer 403 is volatilized after the block copolymer 403 of the solution state is phase-separated such that fluidity of the block copolymer 403 almost disappears, but does not mean that the solvent in the block copolymer 403 is necessarily completely volatilized. Thus, as shown in FIGS. 10 and 11, the block copolymer 403 formed on the wafer W is phase-separated into the first polymer 404 and the second polymer 405 (in a polymer separation process; Step S5 of FIG. 6). In this embodiment, as described above, the ratio of the first polymer 404 in the molecular weight of the block copolymer 403 falls within a range from 40 to 60% and the ratio of the second polymer 405 in the molecular weight of the block copolymer 403 falls within a range from 60 to 40%. As described above, the width of the space portion 402*b* of the resist pattern 402 is set such that the first polymer 404 and the second polymer 405 are alternately arranged by odd-numbered layers. Then, as shown in FIGS. 10 and 11, the block copolymer 403 is phase-separated in a lamella structure in which the first polymer 404 and second polymer 405 are alternately arranged.

In some embodiments, when the polymer separating apparatus 41 performs the phase-separation of the block copolymer 403, an ambient atmosphere of the wafer W may be arbitrarily set. As an example, the ambient atmosphere may be an inert gas atmosphere such as a nitrogen gas, a vacuum atmosphere of a predetermined pressure, an air atmosphere, a low oxygen atmosphere, or a vapor atmosphere formed by the solvent of the block copolymer 403. In addition, since the phase-separation of the block copolymer 403 may occur even at room temperature, the heating process is not necessarily performed at the time of the phase-separation. Thus, for example, the water W may be maintained at room temperature for a predetermined period of time.

Figure 12:
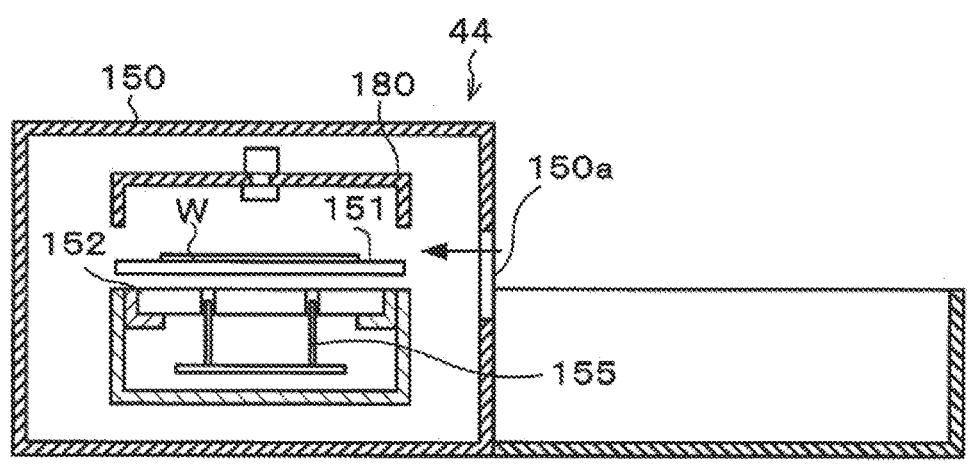
FIG. 12 is an explanatory view showing a state in which a cooling plate of a polymer removal apparatus is moved above a heating plate.

Thereafter, the wafer W is transferred to the polymer removal apparatus 44. For example, as shown in FIG. 12, in the polymer removal apparatus 44, the wafer W is moved above the heating plate 152 with the wafer W mounted on the temperature adjusting plate 151. At this time, the cover body 180 is waiting above the heating plate 152 such that the temperature adjusting plate 151 passes through below the cover body 180. The heating plate 152 has been previously heated to a predetermined temperature.

Figure 13:
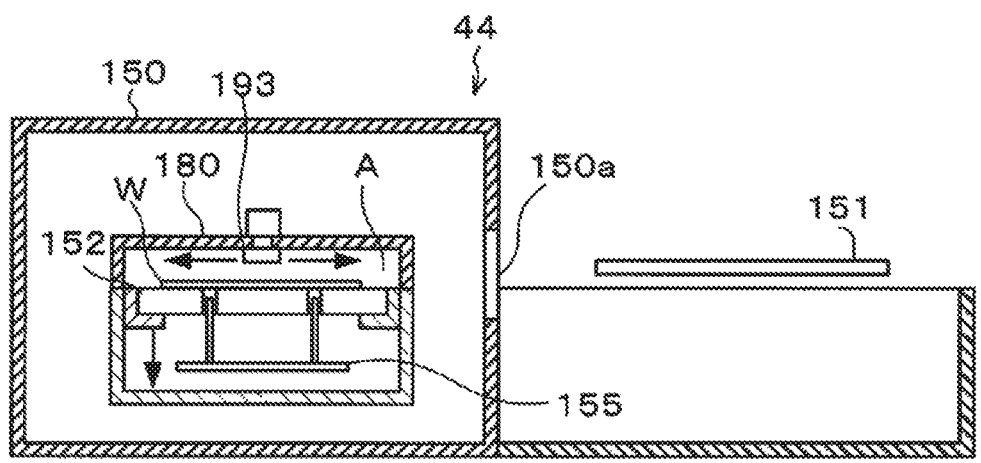
FIG. 13 is an explanatory view showing a state in which a water is transferred on a heating plate and a cover body is moved down.

Thereafter, the wafer W is delivered on the heating plate 152 by the elevating pins 155 and simultaneously, as shown in FIG. 13, the cover body 180 is moved down to form the space A. Subsequently, for example, the nitrogen gas used as the process gas is supplied through the supply nozzle 193 such that the space A is filled with the nitrogen gas. Thus, the space A is kept in the low oxygen atmosphere.

Thereafter, the polymer removal apparatus 44 heats the wafer W at a second temperature to selectively remove the first polymer 404 while keeping the space A in the low oxygen atmosphere (in a polymer removing process; Step S6 of FIG. 6). The second temperature is higher than the first temperature. When the polymethyl methacrylate is used as the first polymer 404 and the polystyrene is used as the second polymer 405 as in this embodiment, the second temperature may be set to about 450 degrees C. or less, and in some embodiments, to fall within a range from 350 to 400 degrees C. The second temperature is determined based on experimental results, which will be described later. Also at this time, a period of heating time is about 10 minutes.

Next, the reason for heating the phase-separated block copolymer 403 at the second temperature using the polymer removal apparatus 44 and effects thereof will be described later.

A polymer constituting the block copolymer 403 includes the benefit that, when the polymer is heated at a heat resistant temperature (a volatilization temperature of the polymer) or higher, a main chain of the polymer is generally cut by a generated thermal energy so that the polymer is thermally decomposed. For this reason, when a film is formed by coating such a polymer, a heat process of the film causes a decrease in thickness of the film. Therefore, the phase-separation of the block copolymer 403 in step S5 is necessarily performed at a temperature lower than the heat resistant temperature.

Figure 14:
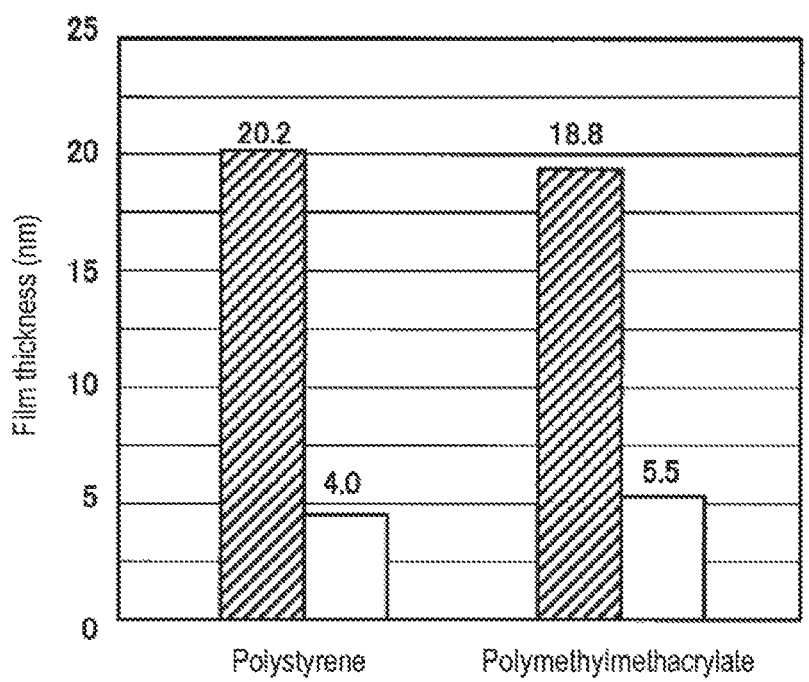
FIG. 14 is a graph showing a change in film thickness when heating a water at a second temperature in an air atmosphere.

FIG. 14 is a graph showing a change in film thickness of each of the first polymer 404 and the second polymer 405, when coating each of the polymethyl methacrylate used as the first polymer 404 and the polystyrene used as the second polymer 405 at a thickness of 20 nm onto the wafer W, followed by heating and hardening the wafer of this structure, followed by further heating the wafer at about 350 degrees C. which is equal to or higher than the heat resistant temperature of the first polymer 404 and the second polymer 405. In FIG. 14, a vertical axis represents a film thickness of each of the first and second polymer 404 and 405. Also, hatched bars respectively represent film thicknesses of the polymethyl methacrylate and the polystyrene after the hardening process and before the further heating process at 350 degrees C., and non-hatched bars respectively represent film thicknesses of the polymethyl methacrylate and the polystyrene after the further heating process at 350 degrees C. In FIG. 14, the further heating process at 350 degrees C. was performed in the air atmosphere, and a period of heating time was about 10 minutes.

As shown in FIG. 14, it was found that the film thicknesses of the polymethyl methacrylate and the polystyrene were both decreased within a range of approximately 70 to 80% by the further heating process at 350 degrees C. which is equal to or higher than the heat resistant temperature.

On the other hand, the present inventors have found that, when the polymethyl methacrylate and the polystyrene were heated in the low oxygen atmosphere, the film thickness of the poly methyl methacrylate was significantly decreased, while the film thickness of the polystyrene was hardly changed.

Figure 15:
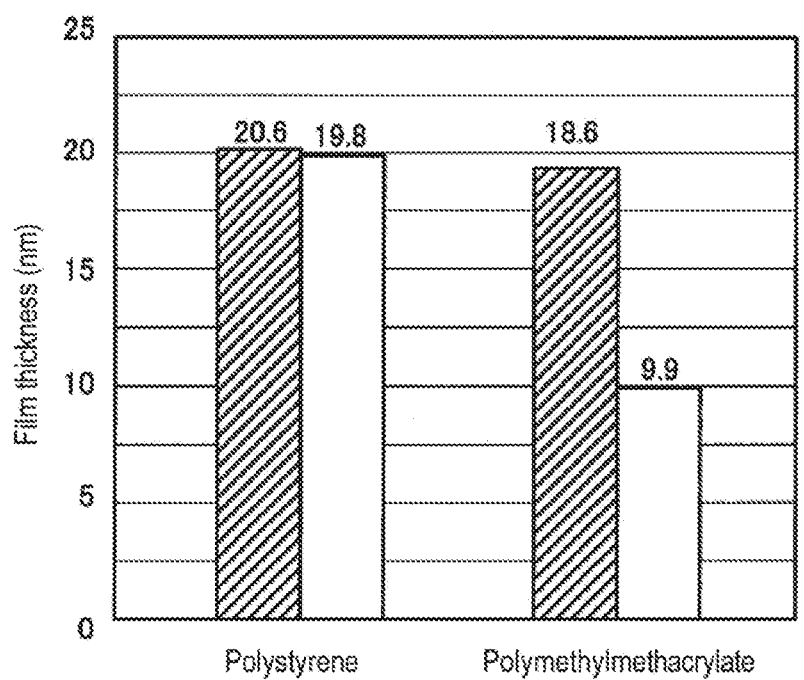
FIG. 15 is a graph showing a thane in film thicknesses when heating a wafer at a second temperature in a low oxygen atmosphere.

FIG. 15 is a graph showing a change in film thickness of each of the polymethyl methacrylate and the polystyrene when the further heating process is performed in the low oxygen atmosphere. As in FIG. 14, a heating temperature, a film thickness and a period of heating time were 350 degrees C., 20 nm and 10 minutes, respectively. In addition, a concentration of oxygen in the low oxygen atmosphere was about 50 ppm. As shown in FIG. 15, when the further heating process was performed in the low oxygen atmosphere, the film thickness of the polystyrene was hardly changed, irrespective of the further heating process at a temperature equal to or higher than the heat resistant temperature. On the other hand, the film thickness of the polymethyl methacrylate was decreased by about 50%. This means that one of two polymers included in the block copolymer 403, i.e., the polymethyl methacrylate used as the first polymer 404 in this embodiment, is selectively reduced by the further heating process in the low oxygen atmosphere.

The present inventors have found that, by prolonging the period of heating time, a decrement in the film thickness of the polymethyl methacrylate is increased, thus decreasing the final film thickness down to zero. In addition, the film thickness of the polymethyl methacrylate begins to be decreased at about 250 degrees C. and is gradually increased as the heating temperature increases. In other words, the prolonging of the period of heating time or the increase in the heating temperature ensures a high selectivity. The present disclosure has been embodied based on such findings. For this reason, the phase-separated block copolymer 403 is further heated at the second temperature in this embodiment. Further, the reason why a difference between the film thicknesses of the polymethyl methacrylate and the polystyrene occurs when performing the further heating process in the low oxygen atmosphere is as follows. That is to say, the polymethyl methacrylate containing an oxygen ado a high molecular structure is oxidized due to its own oxygen atom, irrespective of the presence or absence of an oxygen atom in an atmosphere, thus resulting in a decreased film thickness. In contrast, the polystyrene containing no oxygen atom in the high molecular structure is not oxidized in the low oxygen atmosphere so that a decrease in film thickness is not manifested.

Figure 16:
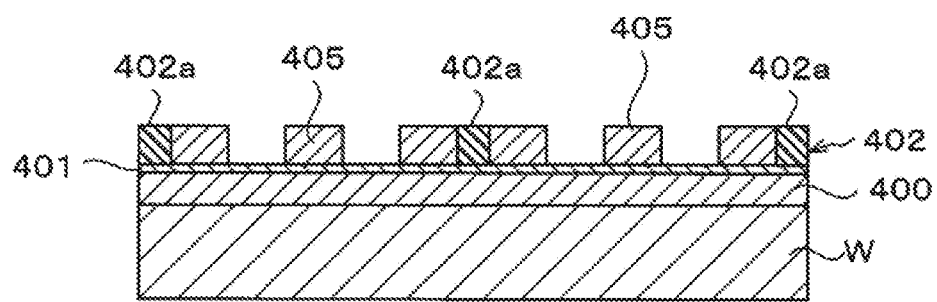
FIG. 16 is a longitudinal cross-sectional view showing a state in which a first polymer is selectively removed.

In the polymer removal apparatus 44, the phase-separated block copolymer 403 is heated at the second temperature such that the first polymer 404 is selectively removed. As a result, as shown in FIG. 16, a predetermined pattern is formed by the second polymer 405. At this time, the film thickness of the second polymer 405 is hardly decreased.

Thereafter, the wafer W is transferred to an etching processing apparatus (not shown) installed outside the substrate processing system 1. In the etching processing apparatus, the wafer W is subjected to an etching process using the second polymer 405 as a mask. Thus, the pattern of the second polymer 405 is transcribed onto the wafer W. For example, an RIE (Reactive Ion Etching) apparatus is used as the etching processing apparatus. That is to say, in the etching processing apparatus, a dry etching for etching films such as the first polymer 404, the anti-reflection film 400 or the neutral layer 401 is performed by a reactive gas (e.g., an etching gas), ions or radicals.

Thereafter, the wafer W is again subjected to the etching process so that the second polymer 405, the neutral layer 401 and the anti-reflection film 400 formed on the wafer W are removed. Subsequently, the wafer W is unloaded from the etching processing apparatus. In this way, a series of the wafer processes is terminated.

According to the above embodiments, the wafer W is heated at the first temperature such that the book copolymer 403 is phase-separated into the first polymer 404 and the second polymer 405 in Step S5. Subsequently, the wafer W is further heated at the second temperature higher than the first temperature in Step S6. Such heating processes are performed in the low oxygen atmosphere. Thus, it is possible to selectively remove the first polymer 404 with high selectivity. This makes it possible to form the predetermined pattern on the wafer W using the second polymer 405 without substantially decreasing the film thickness of the second polymer 405. Accordingly, when the predetermined pattern of the second polymer 405 is used as, e.g., a mask in a subsequent etching process, the second polymer 405 can have a sufficient film thickness to use as the mask.

In addition, as described in the prior art, in order to selectively remove the first polymer 404 using the dry etching, it is required to transfer the wafer W from the substrate processing system 1 to the etching processing apparatus (not shown). However, according to this embodiment, the first polymer 404 is removed by the heating process performed within the substrate processing system 1, thus omitting the transfer process of the wafer W between the substrate processing system 1 and the etching processing apparatus. This improves throughput of the wafer process in the substrate processing system 1.

Further, in the above embodiments, the second temperature has been described to be higher than the first temperature. The present inventors have found that the block copolymer 403 is heated at the first temperature to be phase-separated, and subsequently, the phase-separated block copolymer 403 (i.e., the first polymer 404 and the second polymer 405) is irradiated with ultraviolet rays, which makes it possible to lower the second temperature. This will be described in detail later.

In selectively removing the first polymer 404 by the heating process, a shortened period of heating time improves throughput of the wafer process, and a lowered heating temperature reduces a heat load applied to the wafer W. As a result of the earnest research conducted by the present inventors on how to selectively remove the first polymer 404 at a lower temperature, it was found that, before heating the first polymer 404 at the second temperature, energy is applied to the first polymer 404 to cut the main chain of the first polymer 404, thus resulting in an increased tendency to more easily decompose the first polymer 404.

Figure 17:
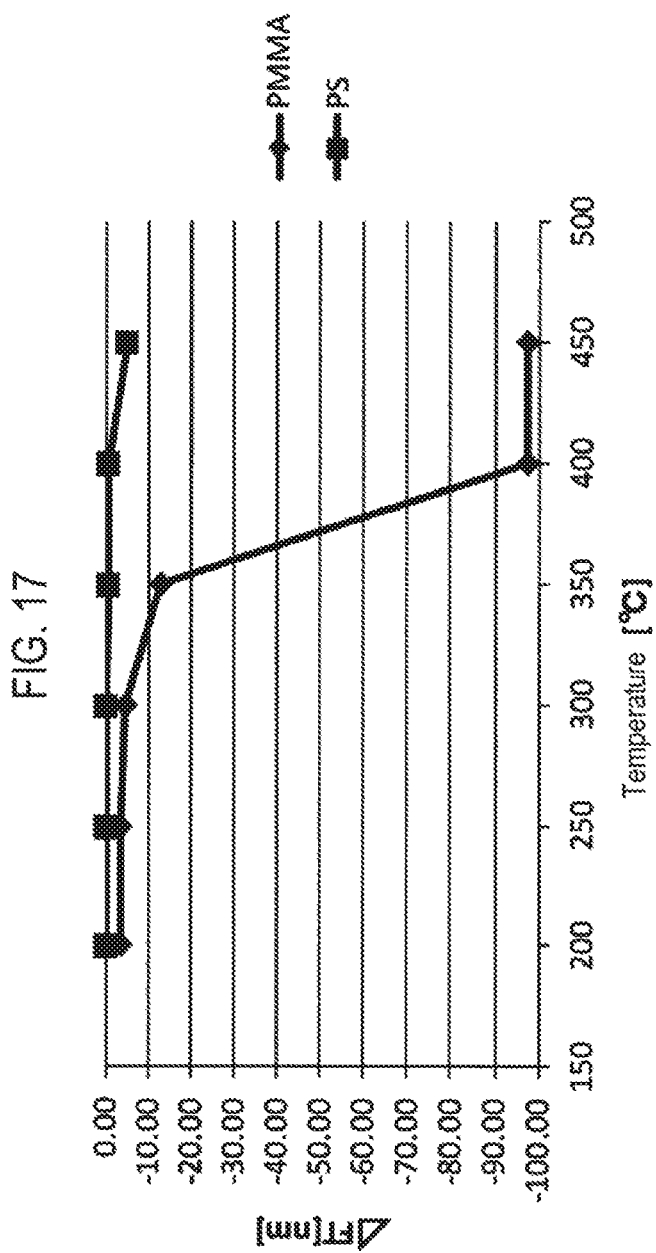
FIG. 17 is a graph showing a change in film thicknesses when heating a wafer in a low oxygen atmosphere.
Figure 18:
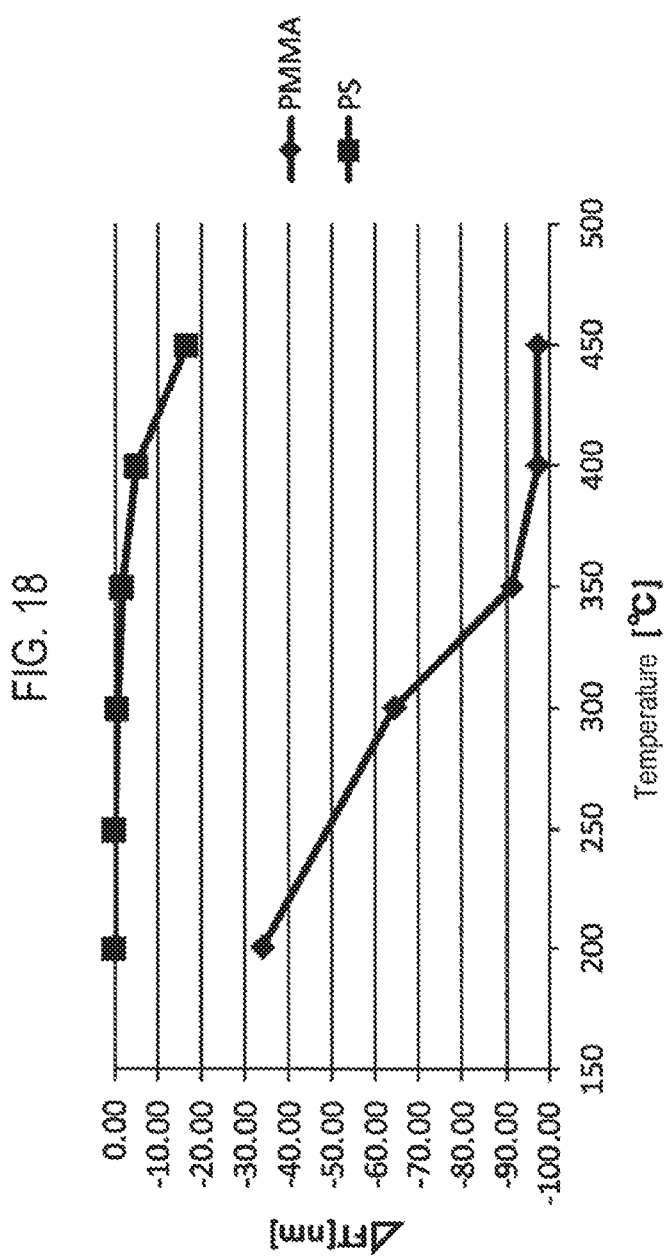
FIG. 18 is a graph showing a change in film thicknesses when heating a wafer in a low oxygen atmosphere after irradiation of ultraviolet rays.

Therefore, the present inventors have checked on a change in decrement of a film thickness of each of the first polymer 404 and the second polymer 405 in a subsequent heating process, depending on the presence or absence of the irradiation of the ultraviolet rays, under a condition where a temperature in the subsequent heating process is changed at an interval of 50 degrees C. within a range from 200 to 450 degrees C. In this case, for example, a wavelength of the irradiated ultraviolet rays was 172 nm or 222 nm and energy thereof was 180 mJ. The results are shown in FIGS. 17 and 18. FIG. 17 is a graph showing a change in film thickness of each of the polymethyl methacrylate and the polystyrene when coating the polymethyl methacrylate (used as the first polymer 404) having a thickness of 100 nm and the polystyrene (used as the second polymer 405) having a thickness of 20 nm onto the wafer W, followed by heating and hardening, followed by further heating the wafer W at a predetermined temperature without irradiating the ultraviolet rays. FIG. 18 is a graph showing a change in film thickness of each of the polymethyl methacrylate and the polystyrene when they were irradiated with the ultraviolet rays after the hardening process and before further heating at the predetermined temperature. In each of FIGS. 17 and 18, a vertical axis represents a change in film thickness of each polymer and a horizontal axis represents a heating temperature of each polymer. In addition, the heating process was performed in the low oxygen atmosphere having an oxygen concentration of 50 ppm in either case.

As shown in FIG. 17, the experiment shows that, in the absence of the irradiation of the ultraviolet rays, the film thickness of the polymethyl methacrylate begins to be decreased at about 300 degrees C. and is rapidly lowered at 400 degrees C. In addition, the experiment shows that the film thickness of the polystyrene is not substantially changed up to about 400 degrees C. and begins to be lowered at about 450 degrees C. Based on these results, in the absence of the irradiation of the ultraviolet rays, the second temperature may be set to about 450 degrees C. or less, and in some embodiments, may be set to fall within a range from 350 to 400 degrees C.

Meanwhile, as shown in FIG. 18, the experiment shows that, in the presence of the irradiation of the ultraviolet rays, the film thickness of the polymethyl methacrylate begins to be decreased at about 200 degrees C. and is saturated from about 350 degrees C. so that a change in film thickness thereof is not substantially manifested. Meanwhile, the experiment shows that the film thickness of the polystyrene begins to be decreased from about 400 degrees C. and becomes substantially zero at about 450 degrees C. Thus, these results show that the ultraviolet rays are irradiated so that the reduction in film thickness of the polymethyl methacrylate per unit time is increased (reduction is faster) and the film thickness of the polymethyl methacrylate begins to be decreased at a lower temperature. In this case, after the irradiation of the ultraviolet rays, a heating temperature (the second temperature) at which the first polymer 404 is selectively removed may be set to approximately 350 degrees C. or less. At this temperature or lower, the film thickness of the polystyrene used as the second polymer 405 begins to be decreased and a temperature at which the reduction of the film thickness of the polymethyl methacrylate is not substantially changed. In some embodiments, the second temperature may fall within a range from 200 to 350 degrees C. In this manner, an etching selectivity of the polymethyl methacrylate to the polystyrene may be set to an appropriate value.

Figure 19:
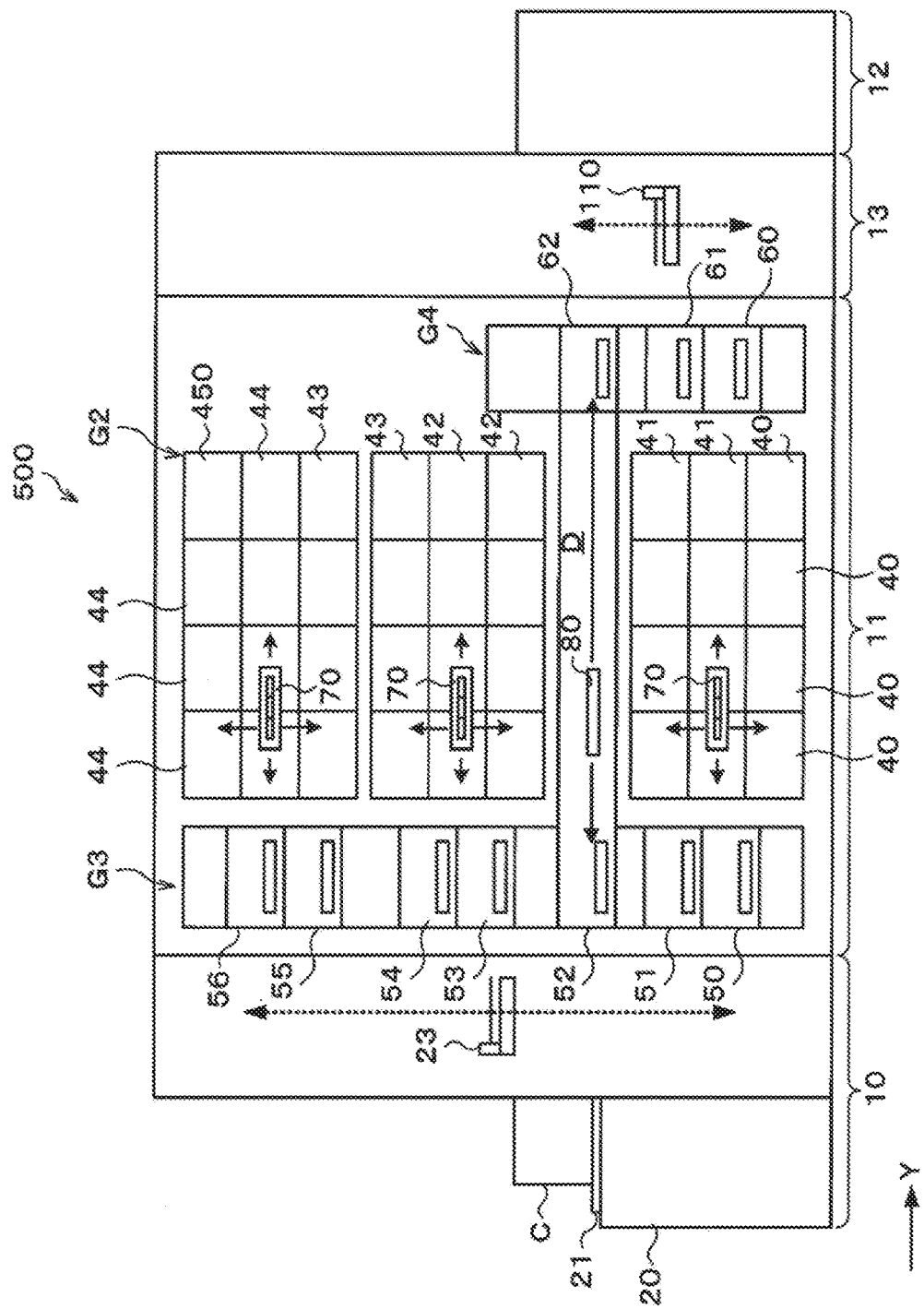
FIG. 19 is a rear view showing a schematic configuration of a substrate processing system according to another embodiment of the present disclosure.

Accordingly, in some embodiments, by irradiating the wafer W with ultraviolet rays between Step S5 and Step S6 described above, a temperature of the heating process in the polymer removal apparatus 44 may be lowered, or the period of the heating time in the polymer removal apparatus 44 may be shortened. In this case, as shown in FIG. 19, a substrate processing system 500 equipped with an ultraviolet ray irradiation apparatus 450 installed in, e.g., the second block G2 and configured to irradiate the wafer W with the ultraviolet rays, may be employed.

Figure 20:
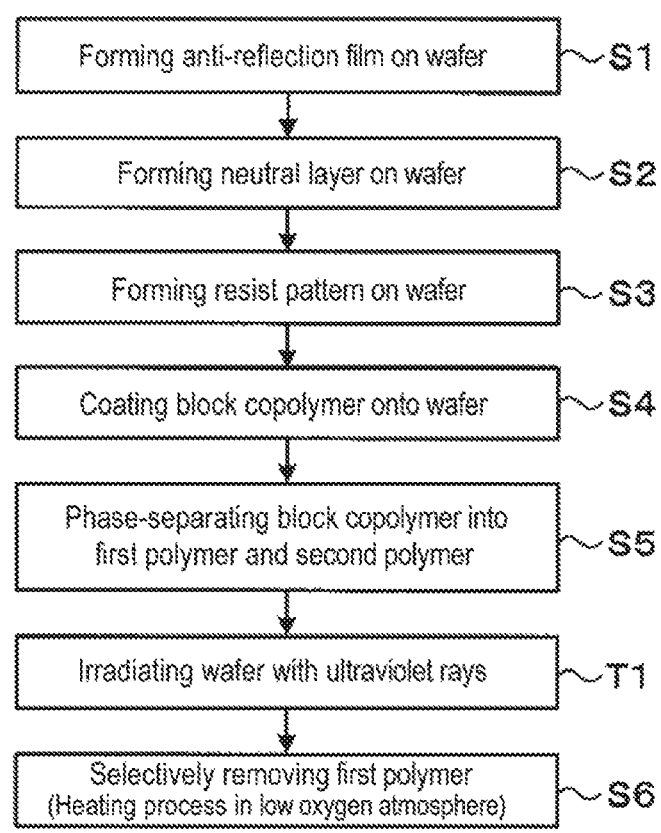
FIG. 20 is a flowchart showing main operations of a wafer process according to another embodiment of the present disclosure.

Next, a wafer process using the substrate processing system 500 will be described. FIG. 20 is a flowchart showing an example of main operations of the wafer process using the substrate processing system 500. Also, Steps S1 to S5 and S6 shown in FIG. 20 are similar to those of FIG. 6 using the substrate processing system 1, and thus, a description thereof will be omitted.

In the substrate processing system 500, after the block copolymer 403 is phase-separated in Step S5, the wafer W is transferred to the ultraviolet ray irradiation apparatus 450 where the wafer W is irradiated with ultraviolet rays (in an ultraviolet ray irradiation process; Step T1 in FIG. 20).

Subsequently, the wafer W is transferred to the polymer removal apparatus 44. In the polymer removal apparatus 44, the wafer W is heated at a temperature (e.g., about 300 degrees C.) identical to, e.g., the first temperature, while maintaining the space A in a low oxygen atmosphere such that the first polymer 404 is selectively removed (in the polymer removing process; Step S6 in FIG. 20). Thereafter, the wafer W is transferred to an etching processing apparatus (not shown) stalled outside the substrate processing system 500. In the etching processing apparatus, the wafer W is subjected to a predetermined etching process such that a pattern of the second polymer 405 is transcribed onto the wafer W.

According to the above embodiments, since the wafer W is irradiated with the ultraviolet rays in Step T1 provided between Steps S5 and S6, it is possible to perform the heating process at a lower temperature in the subsequent Step S6, compared to the absence of the irradiation of the ultraviolet rays. Accordingly, even though a film having a low heat resistant temperature is formed on the wafer W, a method of selectively removing the first polymer 404 by a heating process may be employed. In addition, the heating temperature in Step S6 is lowered, thus reducing a heat load applied to the wafer W.

In addition, the irradiation of the ultraviolet rays in Step T1 further decreases the film thickness of the first polymer 404 per unit time, thus shortening a period of time required to perform Step S6. This improves throughput of the wafer process.

Furthermore, while in the above embodiments, the heating process of the wafer W has been described to be performed using the polymer separating apparatus 41 and the polymer removal apparatus 44. Steps S5 and S6 may not necessarily need to be performed by respective separated apparatuses. In some embodiments, any one of the polymer separating apparatus 41 and the polymer removal apparatus 44 may perform both Step S5 and Step S6.

Furthermore, while in the above embodiments, the polymethyl methacrylate has been described to be used as the first polymer 404, the present disclosure is not limited thereto. In some embodiments, dimethylpolysiloxane, polyethylene oxide, polymethylsiloxane or polyvinylpolypyrrolidone, which contains oxygen in molecule, may be used as the first polymer 404, instead of the polymethyl methacrylate. Alternatively, the first polymer 404 may be used in combination with other second polymers containing no oxygen atom, which distinct from the polystyrene.

Further, while in the above embodiments, the second temperature applied when heating the wafer W in the polymer removal apparatus 44 has been described to be set to 450 degrees C. or less, and especially, to fall within a range from approximately 350 to 400 degrees C. in the absence of the irradiation of the ultraviolet rays; and has been described to be set to 350 degrees C. or less, and especially, to fall within a range from approximately 200 to 350 degrees C., in the presence of the irradiation of the ultraviolet rays, the present disclosure is not limited thereto. In some embodiments, the second temperature may be appropriately determined by combining the first polymer 404 containing the oxygen atom with the second polymer 405 containing no oxygen atom. That is to say, in performing the heating process in the low oxygen atmosphere, a temperature at which the film thickness of the first polymer 404 begins to be decreased and a temperature at which the film thickness of the second polymer 405 begins to be decreased are unique to the respective polymers. For this reason, a temperature range within which an optimal selectivity is secured may be set depending on the combination of the first polymer 404 and the second polymer 405.

Figure 21:
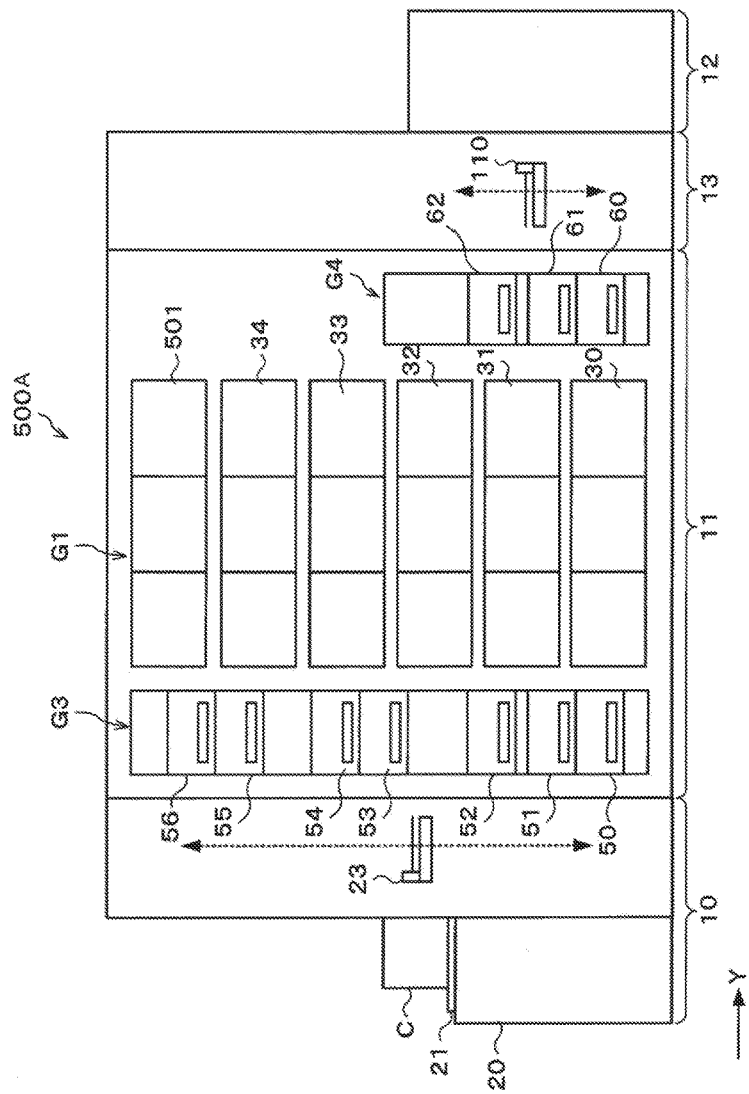
FIG. 21 is a rear view showing a schematic configuration of a substrate processing system according to another embodiment of the present disclosure.

Further, in the above embodiments, the polymethyl methacrylate used as the first polymer 404 is a polymer having a polarity (hydrophilic property) and the polystyrene used as the second polymer 405 is a polymer having no polarity (hydrophobic property). In this case, after the first polymer 404 is irradiated with the ultraviolet rays in Step T1 and is selectively removed by the heating process in Step S6, for example, an organic solvent (a polar organic solvent) having a polarity may be supplied to the wafer W (in a solvent supply process). By the irradiation of the ultraviolet rays, the main chain of the first polymer 404 is cut and the second polymer 405 is hardened by force of a crosslinking reaction. This selectively removes only the first polymer 404 by the polar organic solvent. Thus, it is possible to more reliably remove the first polymer 404 from the wafer W. In this case, for example, as shown in FIG. 21, a substrate processing system 500A equipped with a solvent supply apparatus 501 which is installed in the first block G1 and configured to supply the polar organic solvent to the wafer W, may be employed. Like other liquid processing apparatus such as the resist coating apparatus 33, the solvent supply apparatus 501 is configured to supply solvent to the wafer W by spin coating.

In the above embodiments, the oxygen concentration in the atmosphere when performing the heating process using the polymer removal apparatus 44 has been described to be set to 50 ppm. However the present inventors have found that, when the oxygen concentration falls within a range from about 50 to 10,000 ppm, a selectivity of the first polymer 404 to the second polymer 405 can be set to a desired value. Accordingly, the low oxygen atmosphere used in this embodiment means that the oxygen concentration falls within a range from about 50 to 10,000 ppm.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures. The present disclosure may be applied to various substrates such as a flat panel display (FPD), a mask reticle for a photo mask and the like, other than the wafer.

According to the present disclosure, in performing a substrate process using a block copolymer composed of a first polymer containing oxygen atoms and a second polymer containing oxygen atoms, it is possible to remove the first polymer containing oxygen atoms with a high selectivity, thus appropriately forming a predetermined pattern on the substrate.

The present disclosure is useful in processing a substrate using, e.g., a block copolymer composed of one polymer containing an oxygen atom in a high molecule structure and the other polymer containing no oxygen atom in the high molecule structure.

What is claimed is:

1. A method of processing a substrate using a block copolymer composed of a first polymer containing an oxygen atom and a second polymer containing no oxygen atom, the method comprising:
    coating the block copolymer onto the substrate on which a predetermined pattern is formed;
    phase-separating the block copolymer into the first polymer and the second polymer, wherein, in phase-separating the block copolymer, the substrate onto which the block copolymer is coated is heated at a first temperature such that the block copolymer is phase-separated into the first polymer and the second polymer; and
    after phase-separating the block copolymer, supplying a non-oxidizing gas such that the substrate is kept in a low oxygen atmosphere, and heating the substrate in the low oxygen atmosphere to selectively remove the first polymer from the phase-separated block copolymer, wherein, heating the substrate in the low oxygen atmosphere is performed at a second temperature higher than the first temperature, and
    wherein the first polymer is polymethyl methacrylate and the second polymer is polystyrene.

2. The method of claim 1, wherein the second temperature is 450 degrees C. or less.

3. The method of claim 1, wherein an oxygen concentration in the atmosphere when heating the substrate falls within a range from 50 to 10,000 ppm.

4. A non-transitory computer-readable storage medium having a program operating on a computer stored therein,
    wherein the program, when executed, causes the computer to perform the method of claim 1 using a substrate processing system.

5. A system of processing a substrate using a block copolymer composed of a first polymer containing an oxygen atom and a second polymer containing no oxygen atom, the system comprising:
    a block copolymer coating apparatus configured to coat the block copolymer onto a substrate on which a predetermined pattern is formed;
    a polymer separating apparatus configured to heat the substrate with the block copolymer coated thereonto at a first temperature and configured to phase-separate the block copolymer into the first polymer and the second polymer; and
    a polymer removal apparatus configured to heat the substrate at a second temperature higher than the first temperature in a low-oxygen atmosphere and configured to selectively remove the first polymer from the phase-separated block copolymer, and
    wherein the first polymer is polymethyl methacrylate and the second polymer is polystyrene.

6. The system of claim 4, wherein the second temperature is 450 degrees C. or less.

7. The system of claim 5, wherein an oxygen concentration in the atmosphere when heating the substrate by the polymer removal apparatus falls within a range from 50 to 10,000 ppm.

* * * * *